United States Patent
Li et al.

(10) Patent No.: US 9,843,006 B2
(45) Date of Patent: Dec. 12, 2017

(54) METHOD OF MAKING N-TYPE THIN FILM TRANSISTOR

(71) Applicants: Tsinghua University, Beijing (CN); HON HAI PRECISION INDUSTRY CO., LTD., New Taipei (TW)

(72) Inventors: Guan-Hong Li, Beijing (CN); Qun-Qing Li, Beijing (CN); Yuan-Hao Jin, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 14/981,864

(22) Filed: Dec. 28, 2015

(65) Prior Publication Data

US 2016/0190491 A1   Jun. 30, 2016

(30) Foreign Application Priority Data

Dec. 31, 2014  (CN) .......................... 2014 1 0849259

(51) Int. Cl.
*H01L 51/00* (2006.01)
*H01L 51/05* (2006.01)

(52) U.S. Cl.
CPC ...... *H01L 51/0541* (2013.01); *H01L 51/0096* (2013.01); *H01L 51/0525* (2013.01); *H01L 51/0011* (2013.01); *H01L 51/0048* (2013.01); *H01L 51/0562* (2013.01); *Y02E 10/549* (2013.01)

(58) Field of Classification Search
CPC . H01L 51/0002; H01L 51/0048; H01L 51/00; H01L 51/0558
See application file for complete search history.

(56) References Cited

U.S. PATENT DOCUMENTS

| 5,630,932 | A | * | 5/1997 | Lindsay | ................. G01Q 70/16 204/224 M |
| 7,800,139 | B2 | | 9/2010 | Lee et al. | |
| 9,171,942 | B2 | | 10/2015 | Mochizuki et al. | |
| 2006/0006377 | A1 | | 1/2006 | Golovchenko et al. | |
| 2006/0097275 | A1 | * | 5/2006 | Tsai | ................... H01L 51/5206 257/98 |
| 2008/0017849 | A1 | | 1/2008 | Yukawa et al. | |

(Continued)

FOREIGN PATENT DOCUMENTS

| JP | 04333559 | * | 5/1991 | ............. C23C 14/02 |
| TW | 201246309 | | 11/2012 | |
| TW | 201306137 | | 2/2013 | |

*Primary Examiner* — Kyoung Lee
*Assistant Examiner* — Christina Sylvia
(74) *Attorney, Agent, or Firm* — Steven Reiss (57) ABSTRACT

A method of making N-type semiconductor layer includes following steps. An insulating substrate is provided. An MgO layer is deposited on the insulating substrate. A first dielectric layer is formed by acidizing the MgO layer. A semiconductor carbon nanotube layer is formed to cover the MgO layer. A source electrode and drain electrode are formed to be electrically connected to the semiconductor carbon nanotube layer. A second dielectric layer is applied on the semiconductor carbon nanotube layer. A gate electrode is formed on the second dielectric layer.

19 Claims, 6 Drawing Sheets

(56) References Cited

U.S. PATENT DOCUMENTS

| | | | |
|---|---|---|---|
| 2008/0150556 A1* | 6/2008 | Han | B82Y 15/00 324/693 |
| 2009/0008629 A1* | 1/2009 | Matsumoto | B82Y 10/00 257/24 |
| 2009/0200912 A1 | 8/2009 | Ren et al. | |
| 2009/0246408 A1 | 10/2009 | Chan et al. | |
| 2011/0062419 A1* | 3/2011 | Kikuchi | B82Y 10/00 257/24 |
| 2011/0068324 A1 | 3/2011 | Matsumoto et al. | |
| 2012/0280213 A1 | 11/2012 | Gau et al. | |
| 2012/0302003 A1 | 11/2012 | Shieh et al. | |
| 2013/0105765 A1* | 5/2013 | Haensch | H01L 29/42364 257/29 |
| 2013/0143374 A1* | 6/2013 | Hayashi | B82Y 10/00 438/197 |
| 2013/0236947 A1* | 9/2013 | Naito | B05D 7/24 435/235.1 |
| 2015/0287942 A1* | 10/2015 | Cao | H01L 51/0541 257/347 |

* cited by examiner

METHOD OF MAKING N-TYPE THIN FILM TRANSISTOR

This application claims all benefits accruing under 35 U.S.C. §119 from China Patent Application No. 201410849259.3, filed on Dec. 31, 2014 in the China Intellectual Property Office, the contents of which are hereby incorporated by reference.

BACKGROUND

1. Technical Field

The present invention relates to a method of making N-type thin film transistor.

2. Description of Related Art

Carbon nanotubes, because of its excellent electrical, optical and mechanical properties, has become a strong contender for next-generation semiconductor materials, has been widely used in the preparation and study of thin film transistor (TFT). Scientific research shows that the carbon nanotubes are configured as an intrinsic semiconductor. However, under normal circumstances, such as air, the carbon nanotubes behave as P-type semiconductor characteristics. Thus it is easy to prepare P-type thin film transistors with carbon nanotubes. But the integrated circuits with merely the P-type thin film transistor will greatly reduce the associated performance of the integrated circuits, and increase loss.

The method of making N-type thin film transistor with carbon nanotubes comprises chemical doping, selecting low-work function metal deposition as electrode. However, there are some problems in these methods. The chemical doping methods can not maintain long-term and stable of the device performance. In addition, there is a potential drawback dopant diffusion of pollution. In the thin film transistor adopting low function metal as electrode, the N-type unipolar characteristic is not obvious.

What is needed, therefore, is a method of making N-type TFT that can overcome the above-described shortcomings.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
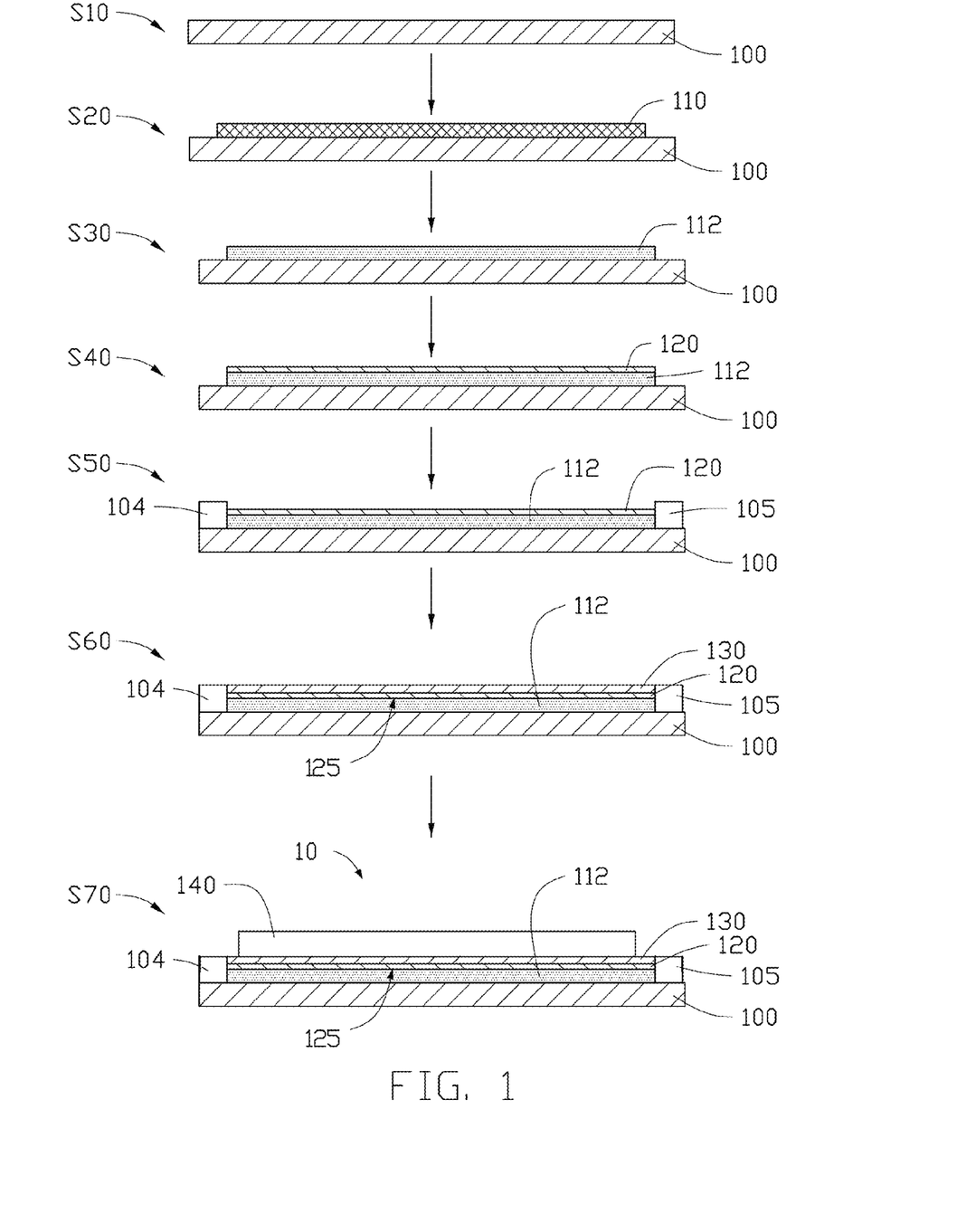
FIG. 1 is a flow chart of one embodiment of a method of making N-type TFT.

Referring to FIG. 1, one embodiment of a method of making an N-type thin film transistor (TFT) 10 comprises:

step (S10), providing an insulating substrate 100;

step (S20), depositing a magnesia (MgO) layer 110 on a surface of the insulating substrate 100;

step (S30), forming a first dielectric layer 112 by acidizing the MgO layer 110;

step (S40), locating a semiconductor carbon nanotube layer 120 to cover the dielectric layer 112;

step (S50), applying a source electrode 104 and a drain electrode 105 to be electrically connected to the semiconductor carbon nanotube layer 120, wherein the source electrode 104 and the drain electrode 105 are spaced from each other;

step (S60), forming a second dielectric layer 130 on the semiconductor carbon nanotube layer 120; and step (S70), applying a gate electrode 140 on the second dielectric layer 130, wherein the gate electrode 140 is insulated from the semiconductor carbon nanotube layer 120.

In step (S10), the insulating substrate 100 can be selected according to the different types of acid in the subsequent acidification, in order to avoid corrosion. A material of the insulating substrate 100 can be hard material or flexible material. The hard material can be as glass, quartz, ceramics, or diamond. The flexible material can be plastics or resins. The flexible material can also be polyethylene terephthalate, polyethylene naphthalate, polyethylene terephthalate, or polyimide. In one embodiment, the material of the insulating substrate 100 is polyethylene terephthalate. The insulating substrate 100 is used to support the different elements on the insulating substrate 100.

In step (S20), the MgO layer 120 can be deposited on the insulating substrate 100 via magnetron sputtering method, evaporation method, or electron beam deposition method. The MgO layer 120 can cover entire the surface of the insulating substrate 100. The MgO layer 120 can be continuously deposited on the insulating substrate 100 during deposition, ensuring that the semiconductor carbon nanotube layer 120 is completely isolated from air. Thus the carbon nanotubes in the semiconductor carbon nanotube layer 120 are isolated from air. A thickness of the MgO layer 120 is greater than 1 nanometer. In one embodiment, the thickness of the MgO layer 120 is greater than or equal to 10 nanometers to isolate the air. If the thickness of the MgO layer 120 is smaller than 1 nanometer, the thin film transistor cannot sustain the stability. Furthermore, the holes in the semiconductor carbon nanotube layer 120 cannot be effectively reduced, and the semiconductor carbon nanotube layer 120 still have P-type property. In one embodiment, the MgO layer 110 is deposited on the insulating substrate 100 via electron beam deposition method, and the thickness of the MgO layer 110 is about 10 nanometers.

In step (S30), the MgO layer 110 can be acidified by an acid. The acid can be hydrochloric acid, sulfuric acid, nitric acid, or other acid. During the acidification process, at least a portion of the MgO layer 110 will be corroded by the acid. During the acidification process, the MgO layer 110 is gradually corroded to form a discontinuous structure, which is the first dielectric layer 112. In one embodiment, the first dielectric layer 112 comprises a plurality of particles dispersed on the insulating substrate 100. Furthermore, the plurality of particles are firmly attached on the insulating substrate 100.

In step (S40), the semiconductor carbon nanotube layer 120 is located on the insulating substrate 100, and covers the first dielectric layer 112. In one embodiment, the semiconductor carbon nanotube layer 120 is located within coverage of the first dielectric layer 112. The semiconductor carbon nanotube layer 120 is in direct contact with the first dielectric layer 112. Thus the first dielectric layer 112 is sandwiched between the substrate 100 and the semiconductor carbon nanotube layer 120.

The semiconductor carbon nanotube layer 120 comprises a plurality of carbon nanotubes. The semiconductor carbon nanotube layer 120 has semi-conductive property. The semiconductor carbon nanotube layer 120 can consist of a plurality of semi-conductive carbon nanotubes. In one embodiment, a few metallic carbon nanotubes can be existed in the semiconductor carbon nanotube layer 120, but the metallic carbon nanotubes cannot affect the semi-conductive property of the semiconductor carbon nanotube layer 120.

The plurality of carbon nanotubes are connected with each other to form a conductive network. The carbon nanotubes of the semiconductor carbon nanotube layer 120 can be orderly arranged to form an ordered carbon nanotube structure or disorderly arranged to form a disordered carbon nanotube structure. The term 'disordered carbon nanotube structure' includes, but is not limited to, a structure where the carbon nanotubes are arranged along many different directions, and the aligning directions of the carbon nanotubes are random. The number of the carbon nanotubes arranged along each different direction can be substantially the same (e.g. uniformly disordered). The disordered carbon nanotube structure can be isotropic. The carbon nanotubes in the disordered carbon nanotube structure can be entangled with each other. The term 'ordered carbon nanotube structure' includes, but is not limited to, a structure where the carbon nanotubes are arranged in a consistently systematic manner, e.g., the carbon nanotubes are arranged approximately along a same direction and/or have two or more sections within each of which the carbon nanotubes are arranged approximately along a same direction (different sections can have different directions).

In one embodiment, the carbon nanotubes in the semiconductor carbon nanotube layer 120 are arranged to extend along the direction substantially parallel to the surface of the carbon nanotube layer. In one embodiment, all the carbon nanotubes in the semiconductor carbon nanotube layer 120 are arranged to extend along the same direction. In another embodiment, some of the carbon nanotubes in the carbon nanotube layer are arranged to extend along a first direction, and some of the carbon nanotubes in the semiconductor carbon nanotube layer 120 are arranged to extend along a second direction, perpendicular to the first direction.

In one embodiment, the semiconductor carbon nanotube layer 120 is a free-standing structure and can be drawn from a carbon nanotube array. The term "free-standing structure" means that the semiconductor carbon nanotube layer 120 can sustain the weight of itself when it is hoisted by a portion thereof without any significant damage to its structural integrity. Thus, the semiconductor carbon nanotube layer 120 can be suspended by two spaced supports. The free-standing semiconductor carbon nanotube layer 120 can be laid on the insulating layer 104 directly and easily. In one embodiment, the semiconductor carbon nanotube layer 120 can be formed on a surface of insulated support (not shown).

The semiconductor carbon nanotube layer 120 can be a substantially pure structure of the carbon nanotubes, with few impurities and chemical functional groups. The semiconductor carbon nanotube layer 120 can also be composed of a combination of semi-conductive and metallic carbon nanotubes obtained via chemical vapor deposition. The ratio between semi-conductive and metallic of carbon nanotubes is 2:1, and the percentage of the semi-conductive carbon nanotubes is about 66.7% in the combination. In one embodiment, all of the metallic carbon nanotubes can be completely removed via chemical separation method. In another embodiment, most of the metallic carbon nanotubes are removed, and there are a few metallic carbon nanotubes left. Furthermore, the percentage of the semi-conductive carbon nanotubes in the semiconductor carbon nanotube layer 120 ranges from about 90% to about 100%. The semiconductor carbon nanotube layer 120 has good semi-conductive property. In one embodiment, the semiconductor carbon nanotube layer 120 consists of a plurality of single-walled carbon nanotubes. The plurality of single-walled carbon nanotubes are parallel with each other.

A diameter of the carbon nanotube is smaller than 2 nanometers. A thickness of the semiconductor carbon nanotube layer 120 ranges from about 0.5 nanometers to about 2 nanometers. A length of the carbon nanotube ranges from about 2 micrometers to about 4 micrometers. In one embodiment, the diameter of the carbon nanotube is greater than 0.9 nanometers and smaller than 1.4 nanometers.

Figure 2:
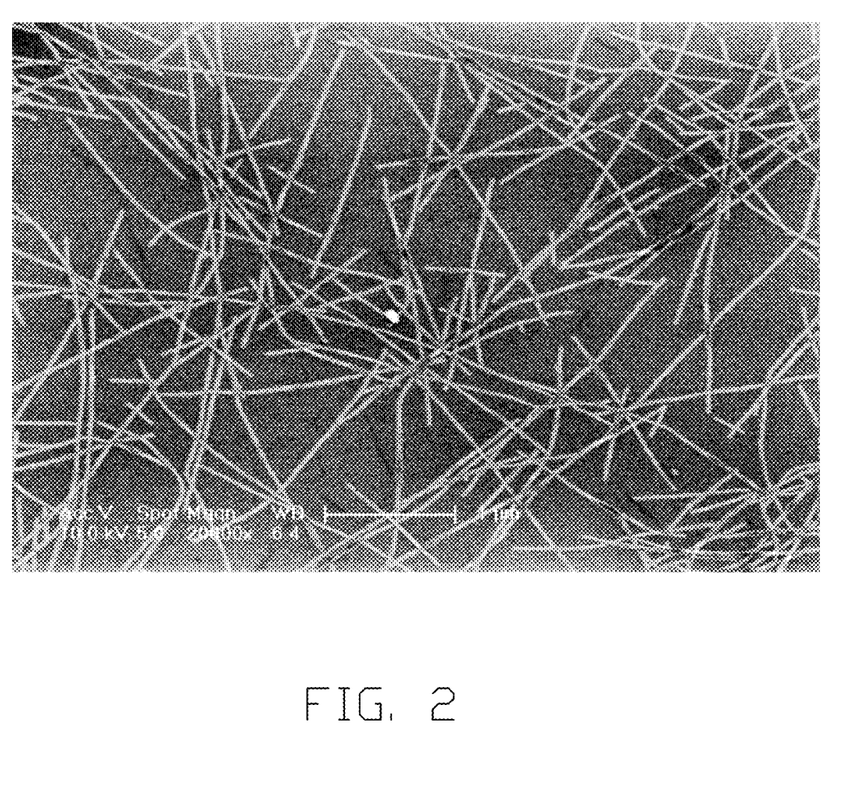
FIG. 2 shows a scanning electron microscope (SEM) view of a semiconductor carbon nanotube film.

Referring to FIG. 2, in one embodiment, the semiconductor carbon nanotube layer 120 consists of the single-walled carbon nanotubes, and the percentage of the semi-conductive carbon nanotubes in the semiconductor carbon nanotube layer 120 is about 98%. The plurality of single-walled carbon nanotubes are entangled with each other to form the conductive network. The diameter of the single-walled carbon nanotube is about 1.2 nanometers. The thickness of the semiconductor carbon nanotube layer 120 is about 1.2 nanometers.

The semiconductor carbon nanotube layer 120 can be formed on the first dielectric layer 112 by:

step (S41), providing a plurality of semiconductor carbon nanotube particles;

step (S42), obtaining a carbon nanotube suspension by mixing the plurality of semiconductor carbon nanotube particles with a solvent; and step (S43), forming the semiconductor carbon nanotube layer 120 by applying the carbon nanotube suspension on the insulating substrate 100.

In step (S41), the plurality of semiconductor carbon nanotube particles can be mixed single-walled carbon nanotubes obtained through arc discharge method. Furthermore, the metallic carbon nanotubes can be removed from the mixed single-walled carbon nanotubes to obtain pure semiconductor single-walled carbon nanotubes. In one embodiment, the percentage of the semiconductor single-walled carbon nanotubes in the plurality of semiconductor carbon nanotube particles is greater than 66.7%. In another embodiment, the percentage of the semi-conductive carbon nanotubes in the plurality of semiconductor carbon nanotube particles is about 98%.

In step (S42), the carbon nanotube suspension can be obtained through stirring method or ultrasonic dispersion method. The plurality of semiconductor carbon nanotube particles are uniformly dispersed in the carbon nanotube suspension. The plurality of semiconductor carbon nanotube particles are dispersed into the solvent and ultrasonicated. The ultrasonic time can range from about 30 minutes to about 3 hours. The ultrasonic power can range from about 300 W to about 600 W. The solvent can be water, ethanol, N-methylpyrrolidone (NMP), acetone, chloroform, or tetrahydrofuran, etc. The solvent has polar groups such hydroxy group or carboxyl group, thus the solvent exhibits a strong polarity, and has a large dielectric constant. The plurality of semiconductor carbon nanotube particles can form the conductive network after mixing process. In one embodiment, the semiconductor carbon nanotube particles are uniformly dispersed in NMP via ultrasonic method. A ratio between a weight of the plurality of semiconductor carbon nanotube particles and volume of the NMP is about 1 mg: 30 ml.

In step (S43), the plurality of carbon nanotubes can be deposited on the insulating substrate 100 by:

locating the insulating substrate 100 at a bottom of container;

pouring the carbon nanotube suspension into the container; and depositing the plurality of carbon nanotubes onto the insulating substrate 100 after standing for a certain time.

The plurality of carbon nanotubes will be deposited on the insulating substrate 100 under weight force and attractive force. Furthermore, the plurality of carbon nanotubes will be deposited on the first dielectric layer 112, and in direct contact with the first dielectric layer 112.

Furthermore, while the semiconductor carbon nanotube layer 120 is a free-standing structure, the semiconductor carbon nanotube layer 120 can be directly laid on the insulating substrate 100. Furthermore, the semiconductor layer 120 can comprise a plurality of wires or a carbon nanotube film. The carbon nanotube film comprises a plurality of carbon nanotubes joined end to end by van der Waals force. The carbon nanotube wire can be obtained by treating the carbon nanotube film with an organic solution. The carbon nanotube film will be shrunk into the carbon nanotube wire.

In step (S50), the source electrode 104 and the drain electrode 105 can be formed via evaporating, sputtering, or printing. In one embodiment, the source electrode 104 is formed on the semiconductor carbon nanotube layer 120 via evaporating. The material of the source electrode 104 and the drain electrode 105 can be metal, alloy, indium tin oxide (ITO), antimony tin oxide (ATO), silver paste, conductive polymer, or metallic carbon nanotubes. The metal or alloy can be aluminum (Al), copper (Cu), tungsten (W), molybdenum (Mo), gold (Au), titanium (Ti), neodymium (Nd), palladium (Pd), cesium (Cs), scandium (Sc), hafnium (Hf), potassium (K), sodium (Na), lithium (Li), nickel (Ni), rhodium (Rh), or platinum (Pt), and combinations of the above-mentioned metal. In one embodiment, the material of the source electrode 104 and the drain electrode 105 can comprises Au and Ti. The thickness of the Ti is about 2 nanometers, and the thickness of the Au is about 50 nanometers. In one embodiment, the source electrode 104 and the drain electrode 105 are located on opposite edges of the insulating substrate 100, and electrically connected to the semiconductor carbon nanotube layer 120. Thus a channel 125 is defined between the source electrode 104 and the drain electrode 105.

In step (S60), the second dielectric layer 130 is located on the semiconductor carbon nanotube layer 120. In one embodiment, the second dielectric layer 130 covers entire the carbon nanotube layer 120. The second dielectric layer 130 is a functional dielectric layer. The term "functional dielectric layer" includes, but is not limited to, that the second dielectric layer 130 can dope the semiconductor carbon nanotube layer 120 under the affect of the first dielectric layer 112. Furthermore, the second dielectric layer 130 is insulating and can isolate the semiconductor carbon nanotube layer 120 from oxygen and water molecular. Thus the semiconductor carbon nanotube layer 120 has N-type property. A material of the second dielectric layer 130 can be aluminum oxide, hafnium oxide, or yttrium oxide.

In detail, the second dielectric layer 130 covers the semiconductor carbon nanotube layer 120, and insulates the gate electrode 140 from the semiconductor carbon nanotube layer 120. In addition, the second dielectric layer 130 has high density, thus the second dielectric layer 130 can isolate the air and the water molecular. Thus the semiconductor carbon nanotube layer 120 is sandwiched between the first dielectric layer 112 and the second dielectric layer 130, and sealed by the insulating substrate 100, the first dielectric layer 112, and the second dielectric layer 130. Furthermore, the second dielectric layer 130 lacks positive charges, thus the semiconductor carbon nanotube layer 120 can be doped with electrons, and the semiconductor carbon nanotube layer 120 has N-type property. A thickness of the second dielectric layer 130 can range from about 20 nanometers to about 40 nanometers. In one embodiment, the thickness of the second dielectric layer 130 ranges from about 25 nanometers to about 30 nanometers. While the thickness of the second dielectric layer 130 is too small, such as smaller than 20 nanometer, the second dielectric layer 130 cannot isolate the air and water molecular. While the thickness is greater than 40 nanometers, the gate electrode 140 cannot modulate the semiconductor carbon nanotube layer 120. In one embodiment, the material of the second dielectric layer 130 is aluminum oxide, and the thickness is about 30 nanometers.

The second dielectric layer 130 can be formed on the semiconductor carbon nanotube layer 120 via atomic layer deposition (ALD) in a temperature of 120° C. Thus the second dielectric layer 130 can have high density and lacks positive charges. Then the second dielectric layer 130 can isolate the air and water, and dopes the semiconductor carbon nanotube layer 120. In one embodiment, the source gas is trimethylaluminum and water vapor, and the carrier gas is nitrogen.

In step (S70), the gate electrode 140 is formed on the second dielectric layer 130 and insulated from the channel 125 formed in the semiconductor carbon nanotube layer 120. Furthermore, the length of the gate electrode 140 can smaller than the length of the channel between the source electrode 104 and the drain electrode 105.

The gate electrode 140 can be formed via evaporating, sputtering, or printing. In one embodiment, the gate electrode 140 is formed on the second dielectric layer 130 via evaporating a composite layer comprising Au and Ti. The material of the gate electrode 140 can be metal, alloy, indium tin oxide (ITO), antimony tin oxide (ATO), silver paste, conductive polymer, or metallic carbon nanotubes. The metal or alloy can be aluminum (Al), copper (Cu), tungsten (W), molybdenum (Mo), gold (Au), titanium (Ti), neodymium (Nd), palladium (Pd), cesium (Cs), scandium (Sc), hafnium (Hf), potassium (K), sodium (Na), lithium (Li), nickel (Ni), rhodium (Rh), or platinum (Pt), and combinations of the above-mentioned metal. In one embodiment, the material of the gate electrode 140 can comprises Au and Ti. The thickness of the Ti is about 2 nanometers, and the thickness of the Au is about 50 nanometers.

In use, the source electrode is grounded. A voltage $V_d$ is applied to the drain electrode. Another voltage $V_g$ is applied on the gate electrode. The voltage $V_g$ forming an electric field in the channel of semiconductor carbon nanotube layer. Accordingly, carriers exist in the channel near the gate electrode. As the $V_g$ increasing, a current is generated and flows through the channel. Thus, the source electrode and the drain electrode are electrically connected.

Figure 3:
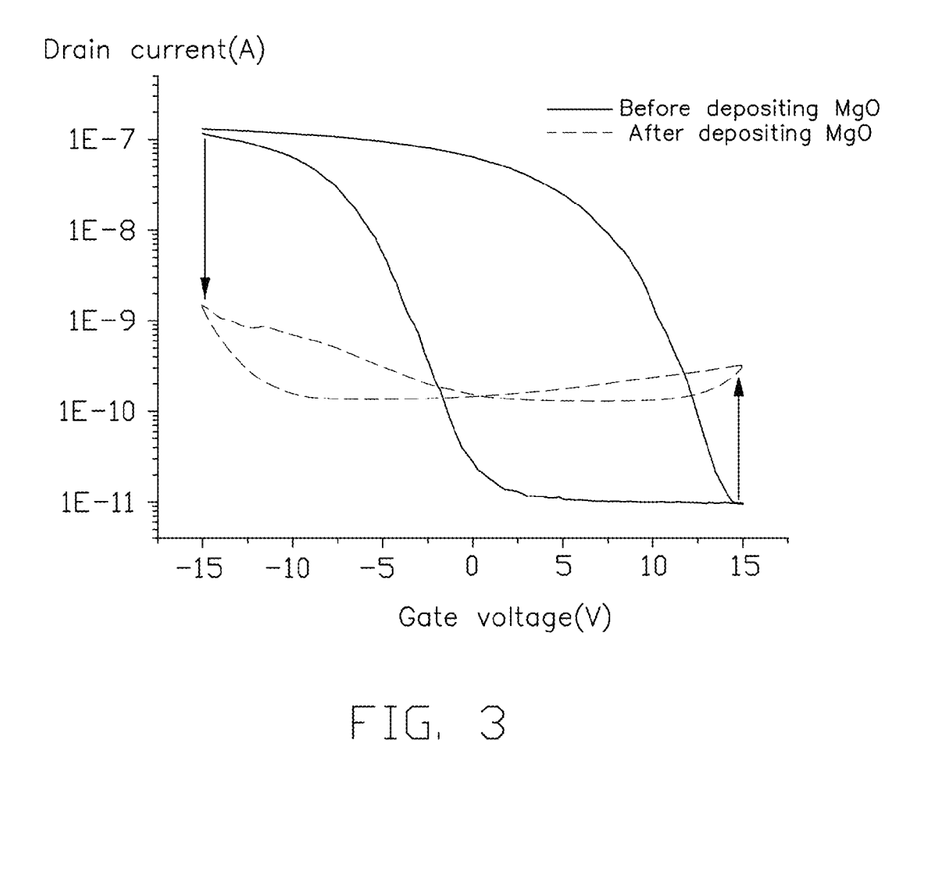
FIG. 3 shows a schematic view of an I-V graph of TFT before and after depositing with MgO.

Referring to FIG. 3, an I-V graph of a TFT before and after depositing the MgO layer is provided. The P-type property is reduced, and N-type property is improved after depositing MgO.

Figure 4:
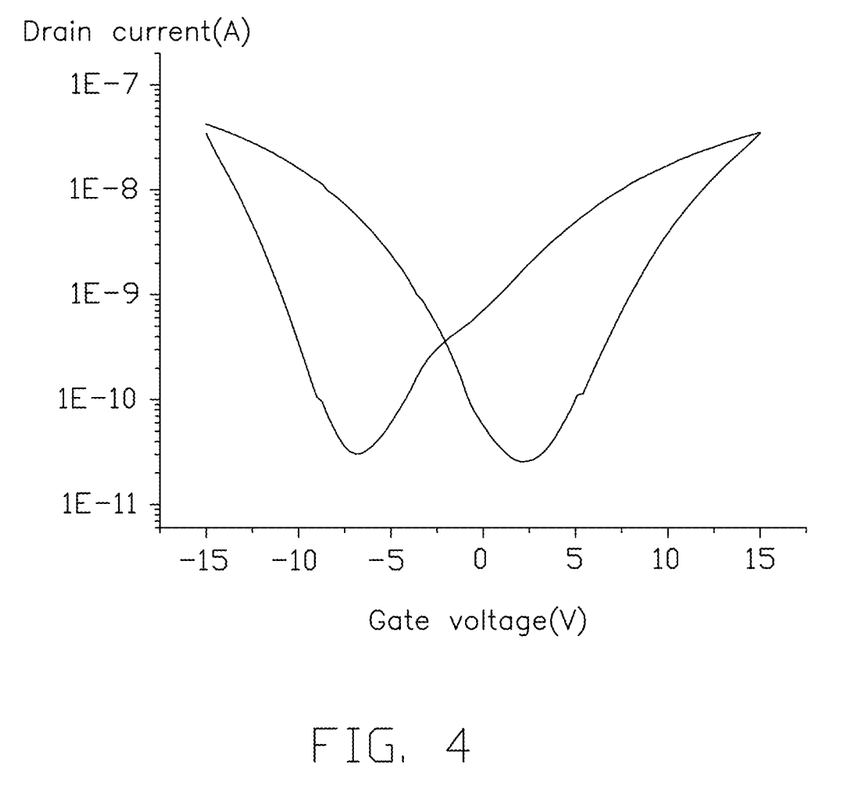
FIG. 4 shows a schematic view of an I-V graph of TFT deposited with a second dielectric layer.

Referring to FIG. 4, an I-V graph of a TFT of depositing the second dielectric layer 130 but without the first dielectric layer 112 is provided. The N-type property is improved, but the P-type property is not changed. Thus the TFT has bipolar property.

Figure 5:
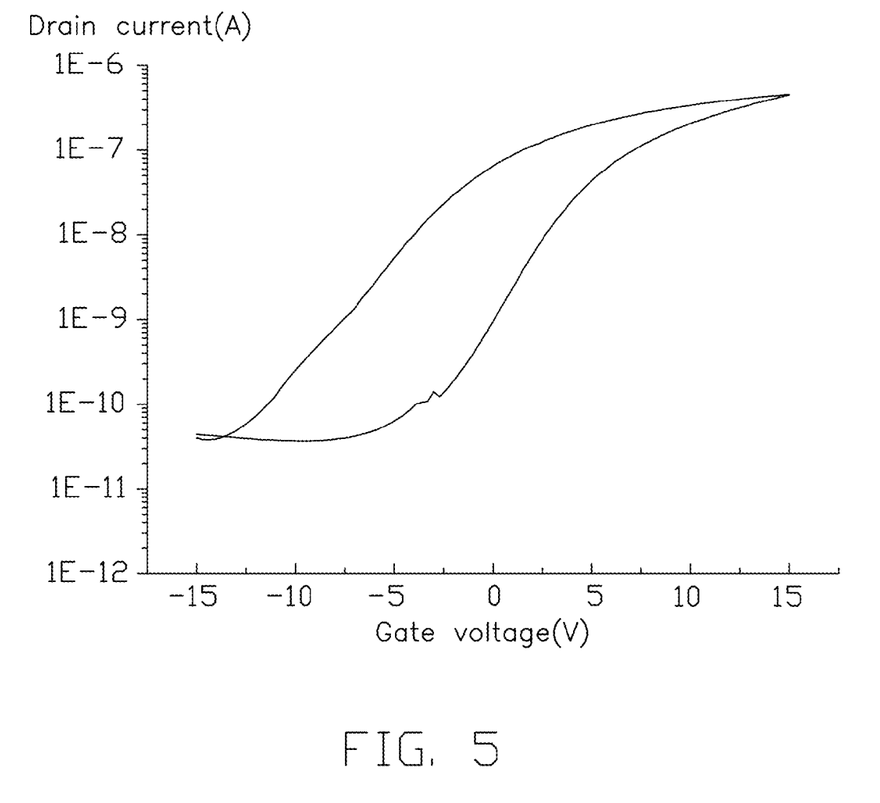
FIG. 5 shows a schematic view of an I-V graph of one embodiment of TFT.

Referring to FIG. 5, an I-V graph of the TFT of one embodiment with the first dielectric layer and the second dielectric layer shows that the TFT has great N-type property.

The method of making N-type TFT has following advantages. The two opposite surfaces of the semiconductor carbon nanotube layer is coated with the first dielectric layer and the second dielectric layer, and the TFT has N-type property. The method has no pollution, and the TFT has great stability. Thus the lifespan of the TFT is prolonged. The method of making N-type TFT can be compatible with the traditional semiconductor process. Furthermore, the method of making N-type TFT can successfully transfer the P-type CNT device into N-type CNT TFT, and then the CMOS can be easily achieved by combining the P-type CNT device and N-type CNT device. Therefore, the integration can be improved, the performance can be enhanced, and the loss can be reduced.

Figure 6:
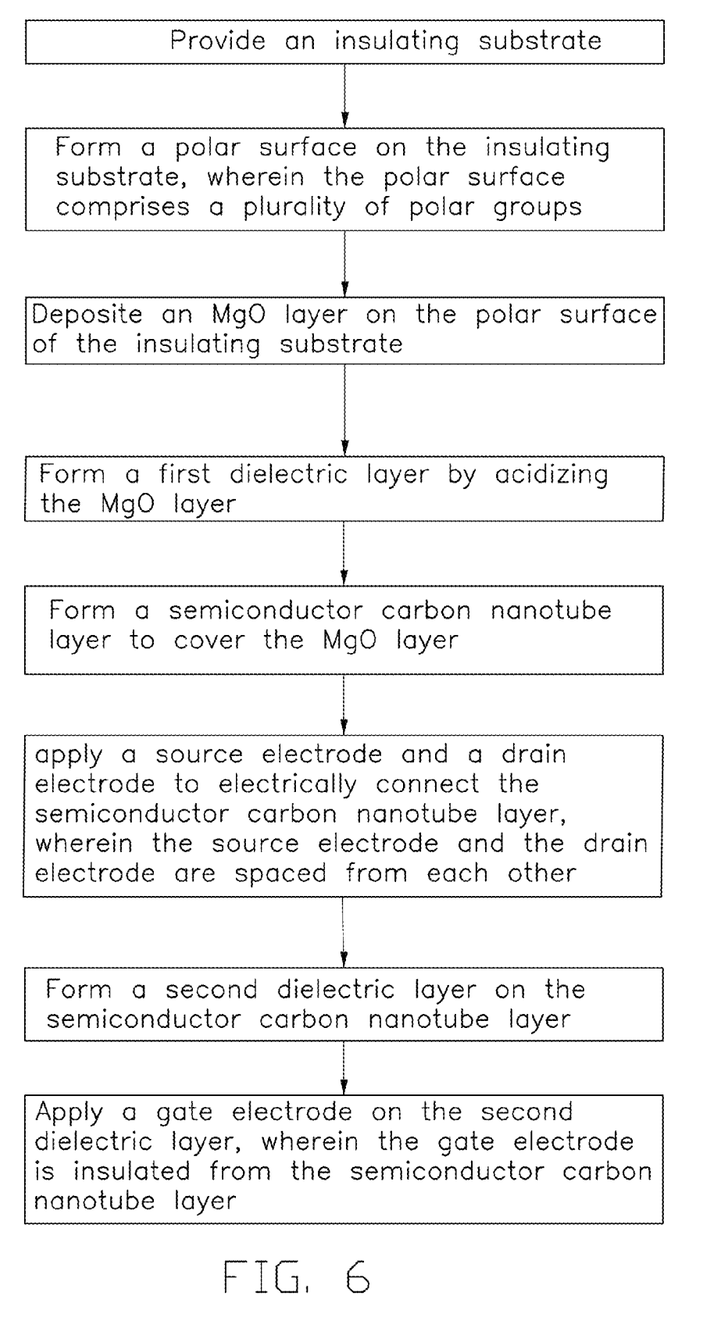
FIG. 6 is a flow chart of another embodiment of a method of making N-type TFT.

Referring to FIG. 6, another embodiment of a method of making N-type TFT 10 comprises:

step (S10), providing an insulating substrate 100;

step (S10'), forming a polar surface on the insulating substrate 100 by treating the insulating substrate 100, wherein the polar surface of the insulating substrate 100 comprises a plurality of polar groups;

step (S20), depositing a magnesia (MgO) layer 110 on the polar surface of the insulating substrate 100;

step (S30), forming a first dielectric layer 112 by acidizing the MgO layer 110;

step (S40), locating a semiconductor carbon nanotube layer 120 to cover dielectric layer 112;

step (S50), applying a source electrode 104 and a drain electrode 105 to be electrically connected to the semiconductor layer 120, wherein the source electrode 104 and the drain electrode 105 are spaced from each other;

step (S60), forming a second dielectric layer 130 on the semiconductor carbon nanotube layer 120; and step (S70), applying a gate electrode 140 on the second dielectric layer 130, wherein the gate electrode 140 is insulated from the semiconductor carbon nanotube layer 120.

In step (S10'), the polar surface of the insulating substrate 100 can be formed by treating a surface of the insulating substrate 100 before forming the semiconductor carbon nanotube layer 120. The polar groups can attracts the plurality of carbon nanotubes in the semiconductor carbon nanotube layer 120.

In one embodiment, the insulating substrate 100 is treated by:

step (S11'), hydrophilic treating the insulating substrate 100 via ion etching; and step (S12'), functionalizing the insulating substrate 100 with an organic solution, wherein the surface of the insulating substrate 100 comprises the plurality of polar groups.

In step (S12'), the organic solution can be aminopropyl triethoxysilane (APTES) solution, or polylysine (poly-L-lysine) solution. Furthermore, other solution with a polar group can be applied. In one embodiment, the organic solution is APTES. The insulating substrate 100 can be firmly adjoined to the APTES. The amino group in the APTES can be firmly adjoined to the MgO layer 110. Thus the MgO layer 110 can be quickly and firmly attached on the insulating substrate 100. Furthermore, the particles in the first dielectric layer 112 can also be tightly attached on the insulating substrate 100. Thus the stability of the N-type TFT 10 can be improved.

Depending on the embodiments, certain of the steps described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

It is to be understood, however, that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the disclosure.

What is claimed is:

1. A method of making N-type thin film transistor, the method comprising:

providing an insulating substrate;

depositing an MgO layer on a surface of the insulating substrate;

forming a first dielectric layer by acidizing the MgO layer, wherein the MgO layer is acidified by hydrochloric acid, sulfuric acid, or nitric acid;

forming a semiconductor carbon nanotube layer on the first dielectric layer so that the first dielectric layer is located between the insulating substrate and the semiconductor carbon nanotube layer;

applying a source electrode and a drain electrode, wherein the source electrode and the drain electrode are spaced from each other and electrically connected to the semiconductor carbon nanotube layer;

forming a second dielectric layer on the semiconductor carbon nanotube layer to dope the semiconductor carbon nanotube layer under the effect of the first dielectric layer; and applying a gate electrode on the second dielectric layer, wherein the gate electrode is insulated from the semiconductor carbon nanotube layer.

2. The method of claim 1, wherein the MgO layer is deposited on the insulating substrate via magnetron sputtering method, evaporation method, or electron beam deposition method.

3. The method of claim 2, wherein the MgO layer covers entire the surface of the insulating substrate.

4. The method of claim 1, wherein a thickness of the MgO layer is greater than or equal to 10 nanometers.

5. The method of claim 1, wherein the MgO layer is corroded to form a plurality of particles dispersed and attached on the surface of the insulating substrate.

6. The method of claim 1, wherein the semiconductor carbon nanotube layer is located within coverage of the first dielectric layer, and in direct contact with the first dielectric layer.

7. The method of claim 1, wherein the semiconductor carbon nanotube layer comprises a plurality of carbon nanotubes.

8. The method of claim 1, wherein the semiconductor carbon nanotube layer comprises a plurality of semi-conductive carbon nanotubes connected with each other to form a conductive network.

9. The method of claim 8, wherein a percentage of the plurality of semi-conductive carbon nanotubes in an amount of carbon nanotubes of the semiconductor carbon nanotube layer is greater than or equal to 66.7%.

10. The method of claim 1, wherein the semiconductor carbon nanotube layer consists of a plurality of semi-conductive carbon nanotubes.

11. The method of claim 1, wherein the forming the semiconductor carbon nanotube layer comprises:
   providing a plurality of semiconductor carbon nanotube particles;
   obtaining a carbon nanotube suspension by mixing the plurality of semiconductor carbon nanotube particles with a solvent; and
   applying the carbon nanotube suspension on the insulating substrate.

12. The method of claim 1, wherein a thickness of the semiconductor carbon nanotube layer ranges from about 0.5 nanometers to about 2 nanometers.

13. The method of claim 1, wherein the second dielectric layer is formed on the semiconductor carbon nanotube layer by atomic layer deposition.

14. The method of claim 1, wherein a material of the second dielectric layer is selected from the group consisting of aluminum oxide, hafnium oxide, and yttrium oxide.

15. The method of claim 1, wherein the second dielectric layer covers entire the semiconductor carbon nanotube layer.

16. The method of claim 1, wherein a thickness of the second dielectric layer ranges from about 20 nanometers to about 40 nanometers.

17. A method of making N-type thin film transistor, the method comprising:
   providing an insulating substrate;
   forming a polar surface on the insulating substrate, wherein the polar surface comprises a plurality of polar groups, and the forming the polar surface comprises:
      hydrophilic treating the insulating substrate via ion etching; and
      functionalizing the insulating substrate with an organic solution;
   depositing an MgO layer on the polar surface of the insulating substrate;
   forming a first dielectric layer by acidizing the MgO layer;
   forming a semiconductor carbon nanotube layer on the first dielectric layer so that the first dielectric layer is located between the insulating substrate and the semiconductor carbon nanotube layer;
   applying a source electrode and a drain electrode, wherein the source electrode and the drain electrode are spaced from each other and electrically connected to the semiconductor carbon nanotube layer;
   forming a second dielectric layer on the semiconductor carbon nanotube layer to dope the semiconductor carbon nanotube layer under the effect of the first dielectric layer; and
   applying a gate electrode on the second dielectric layer, wherein the gate electrode is insulated from the semiconductor carbon nanotube layer.

18. The method of claim 17, wherein the organic solution is aminopropyl triethoxysilane solution or polylysine solution.

19. A method of making N-type thin film transistor, the method comprising:
   providing an insulating substrate;
   depositing an MgO layer on a surface of the insulating substrate;
   forming a first dielectric layer by acidizing the MgO layer;
   forming a semiconductor carbon nanotube layer on the first dielectric layer so that the first dielectric layer is located between the insulating substrate and the semiconductor carbon nanotube layer, wherein a thickness of the semiconductor carbon nanotube layer ranges from about 0.5 nanometers to about 2 nanometers;
   applying a source electrode and a drain electrode, wherein the source electrode and the drain electrode are spaced from each other and electrically connected to the semiconductor carbon nanotube layer;
   forming a second dielectric layer on the semiconductor carbon nanotube layer to dope the semiconductor carbon nanotube layer under the effect of the first dielectric layer; and
   applying a gate electrode on the second dielectric layer, wherein the gate electrode is insulated from the semiconductor carbon nanotube layer.

* * * * *